(12) United States Patent
Hayashi (10) Patent No.: US 10,477,751 B2
(45) Date of Patent: Nov. 12, 2019

(54) COMPONENT MOUNTING SYSTEM AND ERROR STOPPAGE DIAGNOSIS METHOD FOR COMPONENT MOUNTING DEVICE

(71) Applicant: FUJI MACHINE MFG. CO., LTD., Chiryu-shi (JP)

(72) Inventor: Shigeki Hayashi, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 220 days.

(21) Appl. No.: 15/513,206

(22) PCT Filed: Oct. 3, 2014

(86) PCT No.: PCT/JP2014/076615
§ 371 (c)(1),
(2) Date: Mar. 22, 2017

(87) PCT Pub. No.: WO2016/051602
PCT Pub. Date: Apr. 7, 2016

(65) Prior Publication Data
US 2017/0311494 A1    Oct. 26, 2017

(51) Int. Cl.
*H05K 13/08*    (2006.01)
*H05K 13/00*    (2006.01)
(Continued)

(52) U.S. Cl.
CPC .......... *H05K 13/08* (2013.01); *G05B 19/418* (2013.01); *G05B 19/41875* (2013.01);
(Continued)

(58) Field of Classification Search
CPC .......... G06F 19/00; H04N 7/18; H04N 7/183; H04N 7/185; H05K 3/30; H05K 3/303;
(Continued)

(56) References Cited

U.S. PATENT DOCUMENTS 5,249,356 A * 10/1993 Okuda .................... B23P 19/10
                                                                29/833
5,694,219 A * 12/1997 Kim .................... H05K 13/0812
                                                                356/615
(Continued)

FOREIGN PATENT DOCUMENTS

JP    2005-64366 A    3/2005

OTHER PUBLICATIONS

International Search Report dated Nov. 11, 2014, in PCT/JP2014/076615, filed Oct. 3, 2014.

*Primary Examiner* — Carl J Arbes
(74) *Attorney, Agent, or Firm* — Oblon, McClelland, Maier & Neustadt, L.L.P.

(57) ABSTRACT

In a component mounting system, recovery processing is repeated until a recovery count number Nr is larger than or equal to a defined count number Nth in a case where a pickup defect of a component occurs, an elapsed time is measured from error stoppage of a component mounting machine to canceling of the error stoppage in which the component mounting machine is error-stopped when the recovery count number Nr is larger than or equal to the defined count number Nth, the defined count number Nth is increased within a range in which the defined count number does not exceed the upper limit value Nmax in a case where the elapsed time is shorter than a defined time Tth, and the defined count number Nth returns to an initial value in a case where the elapsed time is longer than or equal to the defined time Tth.

6 Claims, 7 Drawing Sheets

(51) Int. Cl.
*H05K 13/04* (2006.01)
*G05B 19/418* (2006.01)

(52) U.S. Cl.
CPC ......... *H05K 13/0015* (2013.01); *H05K 13/04* (2013.01); *H05K 13/083* (2018.08); *H05K 13/0812* (2018.08); *G05B 2219/32222* (2013.01); *G05B 2219/37214* (2013.01)

(58) Field of Classification Search
CPC .... H05K 13/0015; H05K 13/04; H05K 13/08; H05K 13/0812; H05K 13/083; G05B 19/418; G05B 19/41875; G05B 2219/32222; G05B 2219/37214
See application file for complete search history.

(56) References Cited

U.S. PATENT DOCUMENTS

| | | | | |
|---|---|---|---|---|
| 6,041,494 A * | 3/2000 | Mimura | ............ | H05K 13/0452 29/832 |
| 6,144,452 A * | 11/2000 | Hachiya | ................ | G01B 11/14 356/615 |
| 6,222,629 B1 * | 4/2001 | Morris | ............... | G01B 11/2433 356/601 |
| 6,446,333 B1 * | 9/2002 | Kashiwagi | ......... | H05K 13/0813 29/833 |
| 6,497,037 B2 * | 12/2002 | Kawahara | ............ | H05K 13/085 29/832 |
| 6,519,838 B1 * | 2/2003 | Okuda | ................ | H05K 13/0409 29/740 |
| 6,580,961 B2 * | 6/2003 | Diggin | ............ | G05B 19/41875 700/121 |
| 6,631,552 B2 * | 10/2003 | Yamaguchi | ........ | H05K 13/0813 29/739 |
| 6,931,717 B2 * | 8/2005 | Mizuno | .............. | H05K 13/0812 29/740 |
| 7,065,864 B2 * | 6/2006 | Yamamoto | ......... | H05K 13/0413 29/743 |
| 7,089,656 B2 * | 8/2006 | Nagao | ................ | H05K 13/0452 29/740 |
| 7,159,305 B2 * | 1/2007 | Aoki | .................. | H05K 13/0406 29/720 |
| 8,553,080 B2 * | 10/2013 | Endo | .................... | H05K 13/041 348/87 |
| 8,881,385 B2 * | 11/2014 | Endo | .................. | H05K 13/0452 29/840 |
| 2005/0102826 A1 * | 5/2005 | Asai | .................... | H05K 13/0452 29/743 |
| 2007/0074390 A1 * | 4/2007 | Ota | .................... | H05K 13/0812 29/833 |
| 2013/0010101 A1 * | 1/2013 | Yamasaki | .......... | H05K 13/0413 348/92 |

\* cited by examiner

COMPONENT MOUNTING SYSTEM AND ERROR STOPPAGE DIAGNOSIS METHOD FOR COMPONENT MOUNTING DEVICE

TECHNICAL FIELD

The present application relates to a component mounting system including a component mounting device that holds a component and mounts the component on a target object, and an error stoppage diagnosis method that diagnoses the necessity of an error stoppage of the component mounting device.

BACKGROUND ART

In the related art, for this type of component mounting system, a component mounting system that performs recovery processing upon occurrence of an error is known. For example, PTL 1 discloses technology that displays a pickup error screen when a component pickup error occurs, and performs retry processing (recovery processing) of remounting a component when recovery is instructed on the pickup error screen. In addition, PTL 1 also discloses that, when a recognition error of a component occurs, discharge processing, in which the component (defective component) for which the recognition error occurred is moved to a discarding unit and discharged, is performed, then, determination is made as to whether the component for which the recognition error occurred has actually been discharged, retry processing of repeating discharge processing being performed if the discharge is incomplete, and an operator being notified of the error and a device main body being stopped if the quantity of retries reaches a predetermined count number.

PTL 1: JP-A-2005-64366

SUMMARY

In such a component mounting system, normally, a defined count number is set as the upper limit for the quantity of times recovery processing is performed, and a device is error-stopped when the quantity of times the recovery processing has been performed reaches the defined count number. When the error stoppage occurs, an operator has to check error causes, take necessary measures, and then cancel the error stoppage. However, among causes of error stoppages, some factors are considered as factors in which production may be continued, and production efficiency is severely lowered if the device is error-stopped after reaching the uniform regulating quantity for recovery processing for every error.

The present disclosure has a principal object of reducing the frequency of error stoppages and improving efficiency.

The present disclosure adopts the following for achieving the principal object described above.

A component mounting system according to the present disclosure includes:
a component mounting device provided with
  a holding device configured to hold a component,
  a determination device configured to determine whether holding of the component is correctly performed by the holding device,
  a mounting device configured to mount the held component on a target object in a case where the determination device determines that the holding of the component is correctly performed, and
  a recovery device configured to perform recovery processing of re-performing the holding of the component by the holding device in a case where the determination device determines that the holding of the component is not correctly performed;
a counting device configured to count the quantity of times the recovery processing is performed;
an error stoppage device configured to error-stop the component mounting device in a case where the quantity of times the recovery processing is performed reaches a defined count number;
a canceling device configured to cancel the error stoppage of the component mounting device, based on an operation of an operator;
a timekeeping device configured to measure an elapsed time from the error stoppage of the component mounting device by the error stopping device to the canceling of the error stoppage by the canceling device; and
a defined-count-number updating device configured to update the defined count number, based on the measured elapsed time.

In the component mounting system of the present disclosure, determination is made as to whether holding of the component is correctly performed, the held component is mounted on the target object in a case where the determination is made that the holding of the component is correctly performed, the quantity of times the recovery processing has been performed is counted in the component mounting device that performs the recovery processing of re-performing the holding of the component in the case where the determination is made that the holding of the component is not correctly performed, the error stoppage of the component mounting device is performed in a case where the quantity of times the recovery processing has been performed reaches the defined count number, and the error stoppage of the component mounting device is canceled based on the operation of the operator. The elapsed time from the error stoppage of the component mounting device to the canceling of the error stoppage is measured, and the defined count number is updated based on the measured elapsed time. Here, the elapsed time from the error stoppage of the component mounting device to the canceling of the error stoppage is considered to correspond to working time of the operator. Therefore, the shorter the elapsed time to the canceling of the error stoppage, the shorter the working time of the operator. In this case, the error is considered to be minor. Hence, the number of repetitions (defined count number) of the recovery processing is set based on the elapsed time until the error stoppage is canceled, thereby it is possible to error-stop the component mounting device with an appropriate occurrence frequency corresponding to the degree of the error, and thus it is possible to improve efficiency of the component mounting device.

In the component mounting system of the present disclosure, the defined-count-number updating device may increase the defined count number in a case where the error stoppage is canceled before the elapsed time has reached a predetermined time, and the defined-count-number updating device may decrease the defined count number in a case where the error stoppage is canceled when the elapsed time has reached the predetermined time or later. In this configuration, since the number of repetitions of the recovery processing is increased with respect to minor abnormality for which a relatively short stoppage time is taken, it is possible to reduce the frequency of the occurrence of the error stoppage of the device.

In the component mounting system according to such an aspect of the present disclosure, the defined-count-number updating device may increase the defined count number by a predetermined count number whenever the error stoppage is canceled before the elapsed time has reached the predetermined time. Note that the defined count number may be increased by the predetermined count number within a range in which the defined count number does not exceed an upper limit count number.

In addition, in the component mounting system according to such an aspect of the present disclosure, the defined-count-number updating device may cause the defined count number to return to an initial value in the case where the error stoppage is canceled when the elapsed time has reached the predetermined time or later. In this configuration, it is possible to rapidly perform the error stoppage of the device for serious errors for which the error stoppage time is relatively long.

In addition, the component mounting system of the present disclosure may further include an initial value setting device configured to set an initial value of the defined count number, based on an operation of an operator. In this configuration, it is possible to respond to diverse needs of customers.

Further, in the component mounting system of the present disclosure, the determination device may determine a type of a holding defect, in which the holding of the component is not correctly performed, the counting device may count the quantity of times the recovery processing is performed for each of the types of holding defect, multiple defined count numbers associated with each of the types of holding defect may be set as the defined count number, the error stoppage device may error-stop the component mounting device in a case where the quantity of times the recovery processing is performed reaches a defined count number corresponding to the determined type of holding defect, and the defined-count-number updating device may update the defined count number corresponding to the determined type of holding defect, based on the elapsed time measured by the timekeeping device in a case where the component mounting device was error-stopped due to the determined holding defect and then the error stoppage canceled. In this configuration, it is possible to automatically set an appropriate defined count number corresponding to the type of holding defect.

An error stoppage diagnosis method according to the present disclosure includes:
counting the quantity of times recovery processing is performed in a component mounting device provided with a holding device configured to hold a component, a determination device configured to determine whether holding of the component is correctly performed by the holding device, a mounting device configured to mount the held component on a target object in a case where the determination device determines that the holding of the component is correctly performed, and a recovery device for performing recovery processing of re-performing the holding of the component by the holding device in a case where the determination device determines that the holding of the component is not correctly performed;
counting the quantity of times the recovery processing is performed;
error-stopping the component mounting device in a case where the quantity of times the recovery processing is performed reaches a defined count number;
canceling the error stoppage of the component mounting device, based on an operation of an operator;
measuring an elapsed time from the error stoppage of the component mounting device to the canceling of the error stoppage; and
updating the defined count number, based on the measured elapsed time.

DESCRIPTION OF EMBODIMENTS

Hereinafter, an example embodiment of the present disclosure will be described.

Figure 1:
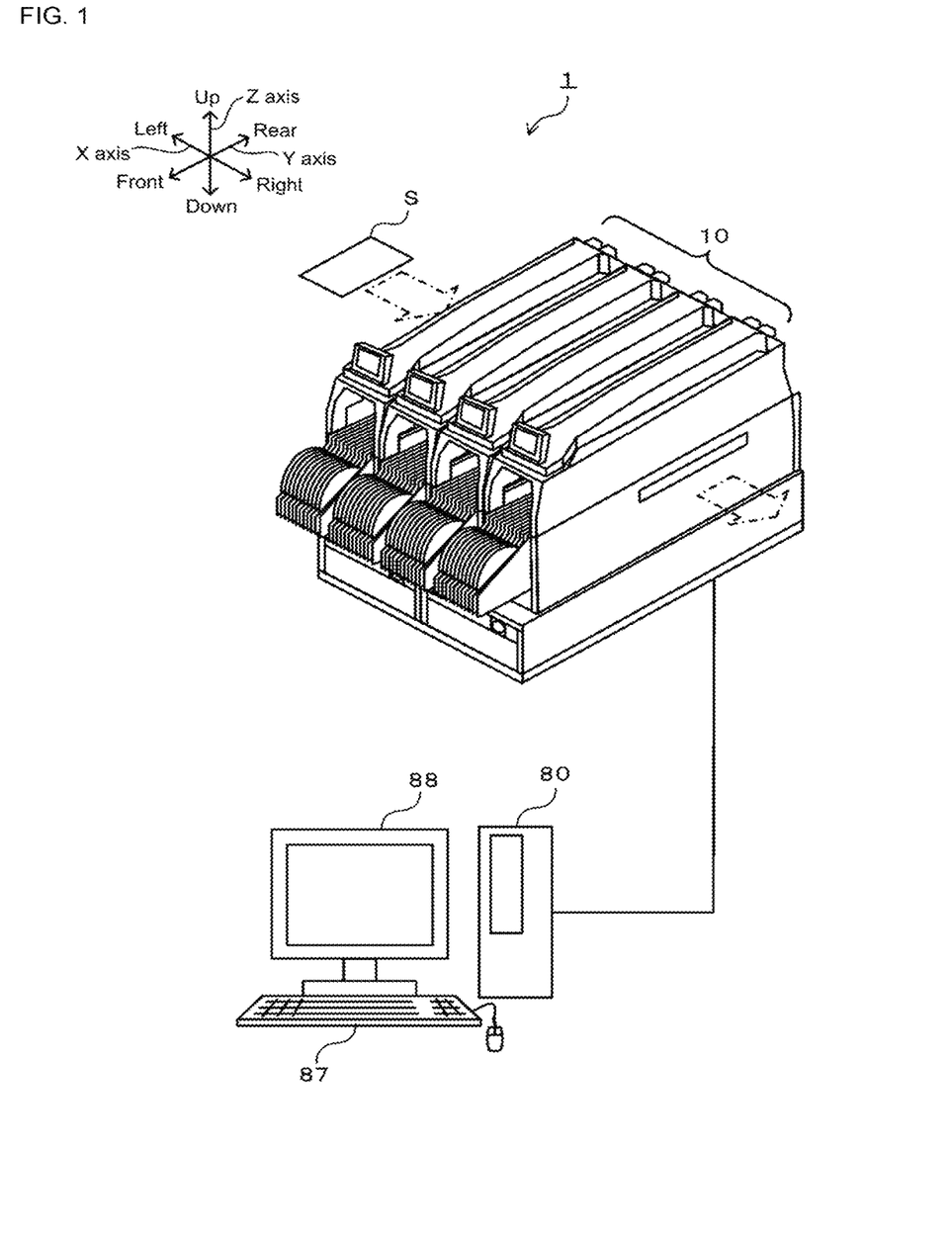
FIG. 1 is a diagram illustrating a schematic configuration of a component mounting system 1 as an example of the present disclosure.
Figure 2:
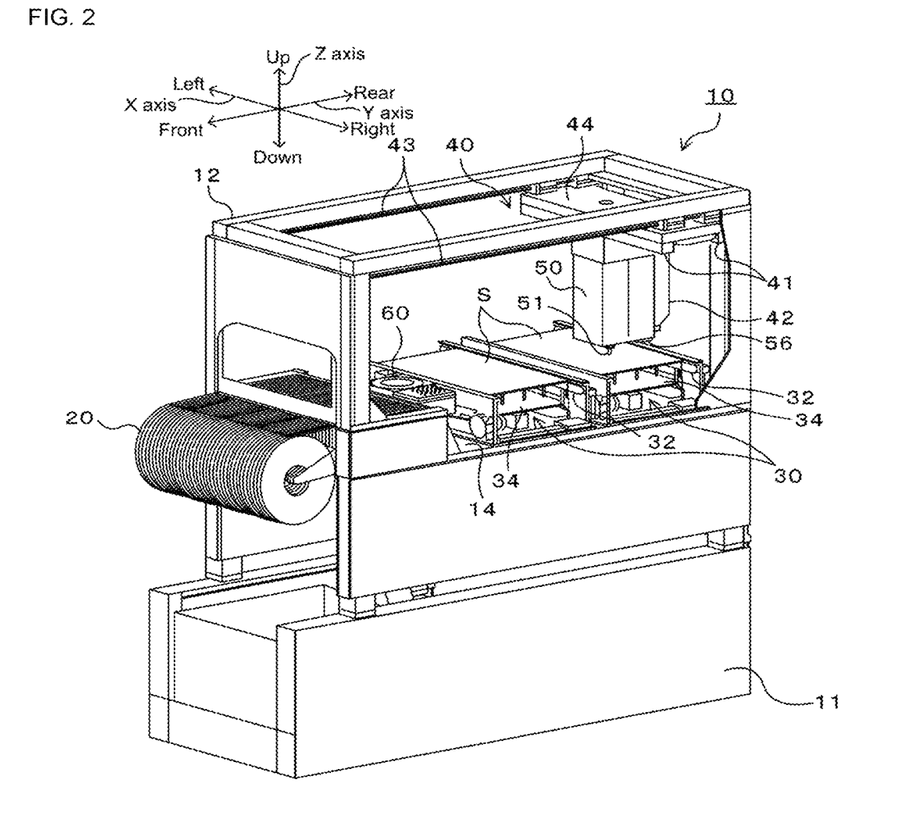
FIG. 2 is a diagram illustrating a schematic configuration of component mounting machine 10.
Figure 3:
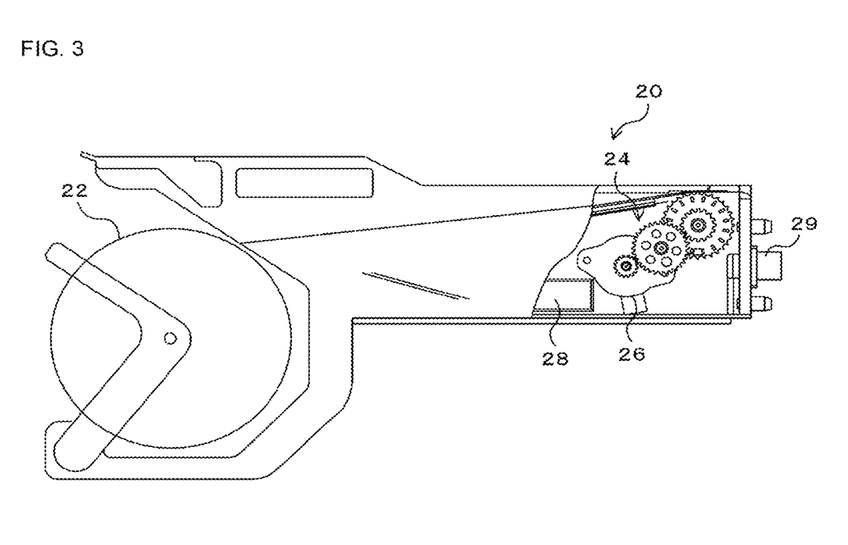
FIG. 3 is a diagram illustrating a schematic configuration of component supply device 20.
Figure 4:
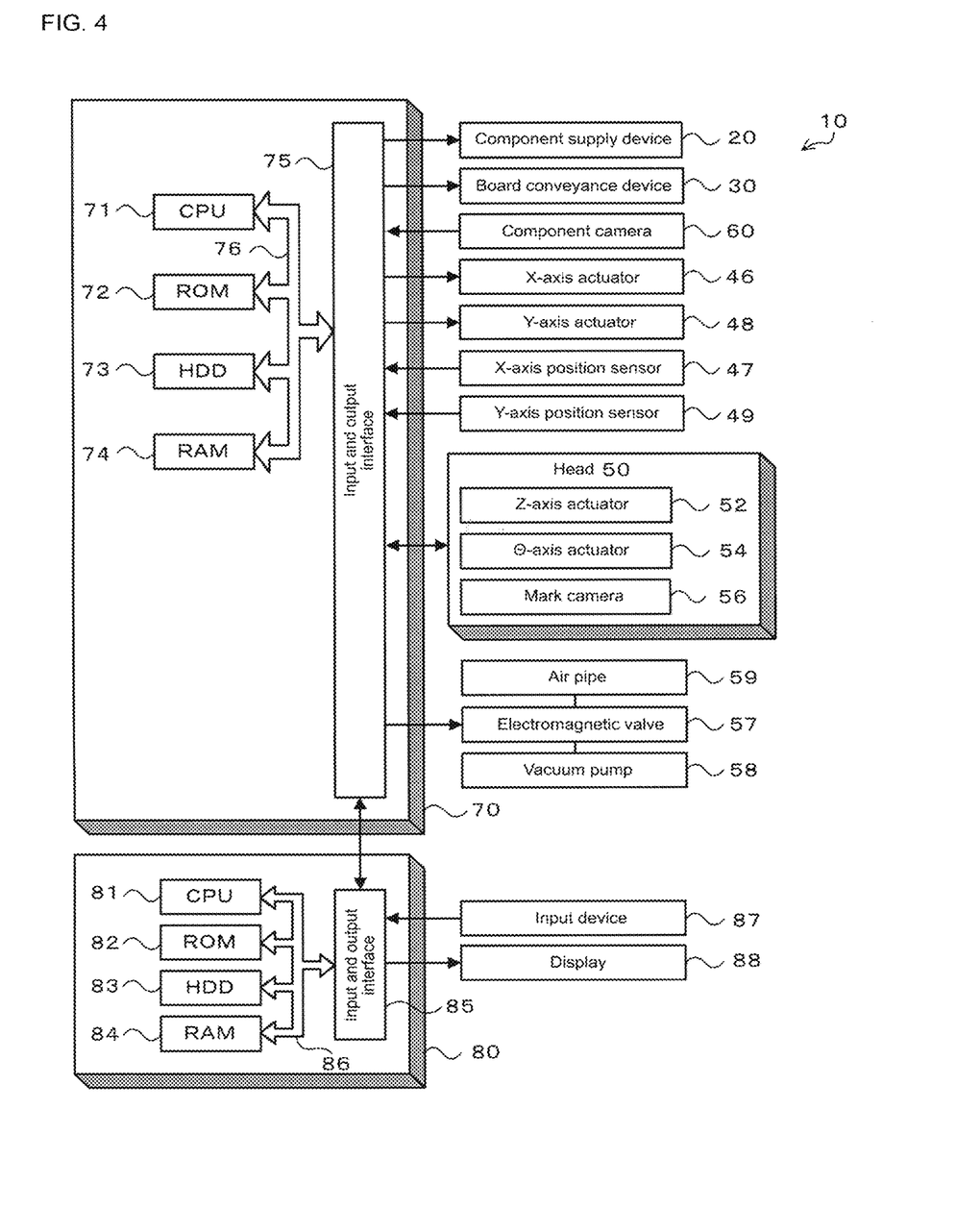
FIG. 4 is a diagram illustrating an electrical connection relationship between control device 70 of component mounting machine 10 and management device 80.

FIG. 1 is a diagram illustrating a schematic configuration of component mounting system 1 as an example of the present disclosure. FIG. 2 is a diagram illustrating a schematic configuration of component mounting machine 10. FIG. 3 is a diagram illustrating a schematic configuration of component supply device 20. FIG. 4 is a diagram illustrating an electrical connection relationship between control device 70 of component mounting machine 10 and management device 80. Note that the left-right direction in FIGS. 1 and 2 is the X-axis direction, the front (near side)-rear (far side) direction is the Y-axis direction, and the up-down direction is the Z-axis direction.

As illustrated in FIG. 1, component mounting system 1 includes multiple component mounting machines 10 disposed to be aligned in a conveyance direction (board conveyance direction) of board S, and management device 80 that manages the entire component mounting system.

As illustrated in FIG. 2, component mounting machine 10 is configured to include, as seen externally, base 11 and main body frame 12 supported by base 11. As illustrated in FIG. 2, component mounting machine 10 includes support table 14 provided in an intermediate portion of main body frame 12, board conveyance device 30 that conveys board S, component supply device 20 that supplies component P, head 50 that causes the component P supplied by component supply device 20 to be picked up by suction nozzle 51 and mounted on board S conveyed by board conveyance device 30, XY robot 40 that causes head 50 to move in XY-directions, and control device 70 (refer to FIG. 4) that controls the entire mounting machine. In addition, component mounting machine 10 further includes mark camera 56 that is provided in head 50 and images board positioning fiducial marks provided on board S, component camera 60 that images a holding of component P held by suction nozzle 51, or the like.

As illustrated in FIG. 3, component supply device 20 is configured of a tape feeder that includes tape reel 22 around which carrier tape is wound, tape feeding mechanism 24 that is driven by driving motor 26, unwinds the carrier tape from tape reel 22, and feeds the carrier tape to a component supply position, a peeling unit (not illustrated) that peels off a top film from the carrier tape and causes the component to be in an exposed state (state in which the component can be picked up), and control board 28 that controls the entire device. Component supply device 20 (tape feeder) is configured to be detachable from a feeder table (not illustrated) formed on support table 14.

When component supply device 20 (tape feeder) is mounted on the feeder table, control board 28 is connected to be able to communicate with the control device of component mounting machine 10 via connector 29. Connector 29 is supplied with power from component mounting machine 10 and is configured as a power supply connector that supplies power to members such as tape feeding mechanism 24 (driving motor 26) or control board 28. Hence, an operator is able to reset the power of component supply device 20 by detaching component supply device 20 (tape feeder) from the feeder table, and then remounting component supply device 20 on the feeder table.

As illustrated in FIG. 2, board conveyance device 30 includes belt conveyor device 32 and conveys board S from left to right (in the board conveyance direction) in FIG. 1 by the driving of belt conveyor device 32. Backup plate 34 that backs up the conveyed board S from the underside is provided at a central portion of board conveyance device 30 in the board conveyance direction (X-axis direction).

As illustrated in FIG. 4, head 50 includes Z-axis actuator 52 that causes suction nozzle 51 to move in the Z-axis (up and down) direction, and θ-axis actuator 54 that causes suction nozzle 51 to rotate around the Z axis. A suction port of suction nozzle 51 is formed to be selectively connected with either vacuum pump 58 or air pipe 59 via electromagnetic valve 57. Control device 70 drives electromagnetic valve 57 such that the suction port of suction nozzle 51 connects with vacuum pump 58, thereby making it possible to cause the suction port to have negative pressure and to pick up the component P. Otherwise, the control device drives electromagnetic valve 57 such that the suction port of suction nozzle 51 connects with air pipe 59, thereby making it possible to cause the suction port to have positive pressure and to release the pickup of the component P.

As illustrated in FIG. 2, XY robot 40 includes Y-axis guide rails 43 provided to be parallel to the front-back direction (Y-axis direction) in an upper portion of main body frame 12, Y-axis slider 44 that is movable along Y-axis guide rails 43 in a bridging state between Y-axis guide rails 43, X-axis guide rails 41 provided to be parallel to the left-right direction (X-axis direction) on a lower face of Y-axis slider 44, and X-axis slider 42 that is movable along X-axis guide rails 41. Head 50 is attached to X-axis slider 42, control device 70 drives and controls XY robot 40, and thereby it is possible to cause head 50 to move to any position on an XY-plane.

When the component P picked up by suction nozzle 51 passes over component camera 60, component camera 60 images the component P and outputs an acquired captured image to control device 70. Control device 70 performs image processing on the captured image captured by component camera 60, and thereby the control device discerns whether the component P that is held by suction nozzle 51 is a correct component and determines whether the component P is correctly held by suction nozzle 51.

As illustrated in FIG. 4, control device 70 is configured as a microprocessor with CPU 71 as a main unit and includes ROM 72, HDD 73, RAM 74, and input and output interface 75, in addition to CPU 71. The members above are electrically connected via bus 76. A position signal from X-axis position sensor 47 that detects a position of X-axis slider 42, a position signal from Y-axis position sensor 49 that detects a position of Y-axis slider 44, an image signal of mark camera 56, an image signal from component camera 60, and the like is input to control device 70 via input and output interface 75. On the other hand, control device 70 outputs a control signal to component supply device 20, a control signal to board conveyance device 30, a drive signal to X-axis actuator 46 that causes X-axis slider 42 to move, a drive signal to Y-axis actuator 48 that causes Y-axis slider 44 to move, a drive signal to Z-axis actuator 52, a drive signal to θ-axis actuator 54, a drive signal to electromagnetic valve 57, and the like via input and output interface 75. In addition, control device 70 is connected to management device 80 in a bidirectional communication manner, and exchange of data and control signals is performed between the two items.

For example, management device 80 is a general-purpose computer, and, as illustrated in FIG. 4, includes CPU 81, ROM 82, HDD 83, RAM 84, and input and output interface 85. The members above are electrically connected via bus 86. An input signal is input to management device 80 from input device 87, such as a mouse or a keyboard, via input and output interface 85. In addition, an image signal is output from management device 80 to display 88 via input and output interface 85. HDD 83 stores a production plan of the board S. Here, the production plan of the board S means a plan that sets an order in which components are mounted on the board S in component mounting machine 10, and the number of boards S mounted with components P to produce. The production plan includes board data related to the board that is produced, head data related to head 50 that is used, nozzle data related to suction nozzles 51 that are used, component data related to components P that are mounted, mounting position data related to mounting positions of the components, and the like. Management device 80 generates production plans, based on data (production quantity or board data, component data, mounting position data, or the like) input by an operator via input device 87, and transmits the generated production plans to component mounting machines 10.

Figure 5:
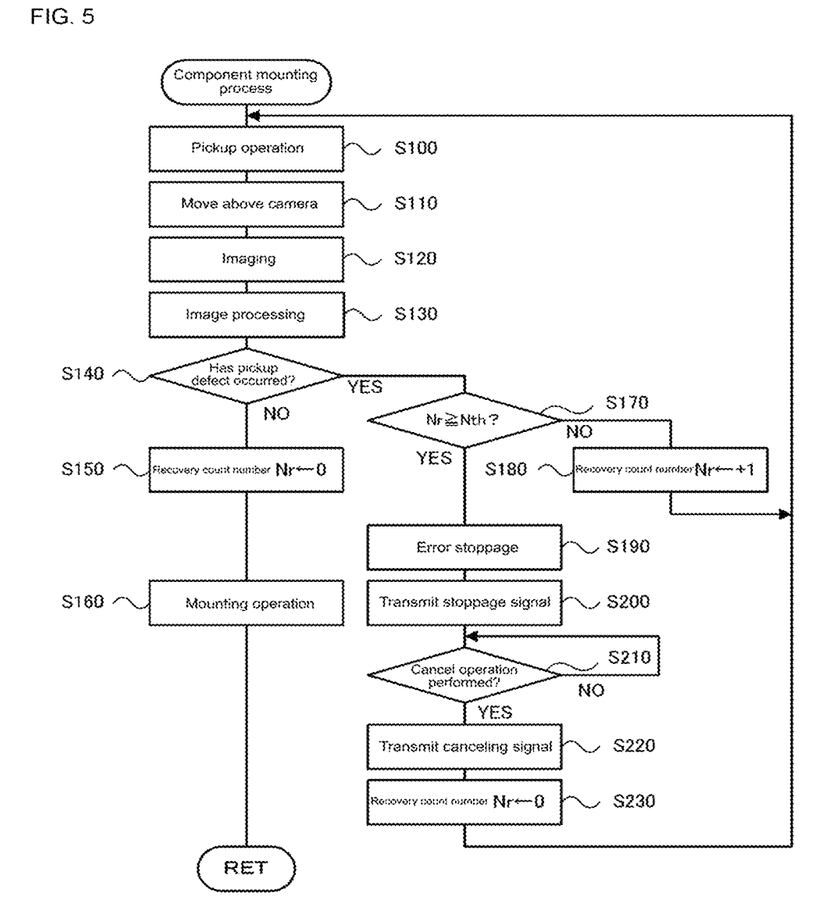
FIG. 5 is a flowchart illustrating an example of a component mounting process that is performed by control device 70 of component mounting machine 10.

Next, operation of component mounting system 1 (component mounting machine 10) of an embodiment having such a configuration will be described. FIG. 5 is a flowchart illustrating an example of a component mounting process that is performed by CPU 71 of control device 70. This process is performed when the operator instructs to start production. Control device 70 receives the production plan transmitted from management device 80 and performs the component mounting process in accordance with the received production plan.

When the component mounting process is performed, CPU 71 of control device 70 first performs a pickup operation of causing suction nozzle 51 to pick up the component P supplied from component supply device 20 (S100). Here, the pickup operation is performed by, specifically, drive control of XY robot 40 such that suction nozzle 51 mounted on head 50 comes immediately above the component P, then, drive control of Z-axis actuator 52 such that suction nozzle 51 is lowered until the suction port comes into contact with the component P, and drive control of electromagnetic valve 57 such that the suction port of suction nozzle 51 has negative pressure. Subsequently, CPU 71 drives and controls XY robot 40 such that the component P picked up by suction nozzle 51 moves above component camera 60 (S110), and images the component P with component camera 60 (S120).

CPU 71 performs image processing on the captured image (S130), and determines whether a pickup defect has occurred (whether the component P is correctly held by suction nozzle 51) (S140). Note that pickup defects include pickup failure in which the component P is not held by suction nozzle 51, an upright pickup error in which the component P is held by the suction nozzle 51 in an upright state, a pickup deviation error in which pickup position deviation exceeding an allowable range occurs to the component P that is held by suction nozzle 51, a wrong component error in which the component P held by suction nozzle 51 is not the correct component, and so on.

When CPU 71 determines that a pickup defect has not occurred, the CPU initializes a recovery count number Nr to a value of 0 (S150), performs a mounting operation of mounting the component P held by suction nozzle 51 to a mounting position on the board S (S160), and ends the component mounting process. Here, the mounting operation is performed by, specifically, drive control of XY robot 40 such that the component P held by suction nozzle 51 comes immediately above the mounting position on the board S, then, drive control of Z-axis actuator 52 such that suction nozzle 51 is lowered until the component P comes into contact with the mounting position on the board S, and drive control of electromagnetic valve 57 such that the suction port of suction nozzle 51 has positive pressure.

On the other hand, when CPU 71 determines that a pickup defect has occurred, the CPU determines whether the recovery count number Nr is larger than or equal to a defined count number Nth (S170). Here, the defined count number Nth means the quantity of repetitions of the recovery processing which are allowed, and is updated by the management device 80 performing a defined-count-number updating process which will be described below. Note that the defined count number Nth is set to an initial value Nini at the time of start of production. When CPU 71 determines that the recovery count number Nr is smaller than the defined count number Nth, an increment in the recovery count number Nr by 1 is performed (S180), processing return to S100, and the recovery processing of repeating the pickup operation is performed. Note that CPU 71 performs, as the recovery processing, discharge processing of discharging the component P held by suction nozzle 51 before the pickup operation. Here, as a cause of a pickup defect, various factors may be considered, such as an error in tape feeding by component supply device 20 (tape feeder), a problem with suction nozzle 51, an error in image processing, and, depending on the cause of the pickup defect, there may be no problem in continuing production. The recovery processing is repeatedly performed within a range of the defined count number Nth, and thereby production efficiency is prevented from being degraded due to error stoppages. On the other hand, when CPU 71 determines that the recovery count number Nr is larger than or equal to the defined count number Nth, error stoppage of component mounting machine 10 is performed (S190), and a stoppage signal is transmitted to management device 80 (S200). Management device 80 that receives the stoppage signal performs error notification which will be described below. In this manner, the operator checks circumstances of the error stoppage, takes necessary measures, and cancels the error stoppage. In the present embodiment, the operator detaches component supply device 20 (tape feeder) from the feeder table then remounts the component supply device, thereby resetting feeder power, and thereby cancelling the error stoppage. Note that, when the feeder power is reset, component supply device 20 (tape feeder) performs predetermined initialization operations such as positioning tape feeding mechanism 24 (sprocket) at the original point.

Here, as described above, in a case where CPU 71 determines that a pickup defect has not occurred and performs the mounting operation, because the recovery count number Nr is initialized to a value of 0, error stoppage is not performed as long as pickup defects do not occur consecutively and the quantity of recovery processing performed consecutively is not larger than or equal to the defined count number Nth.

When CPU 71 transmits the stoppage signal to management device 80, the CPU is on standby (S210) until the operator performs a canceling operation. When the canceling operation is performed, the CPU transmits a stoppage canceling signal to management device 80 (S220), resets the recovery count number Nr to the value of 0 (S230), and processing returns to the processing (mounting operation) in S100. In this manner, component mounting machine 10 cancels the error stoppage state and restarts production.

Figure 6:
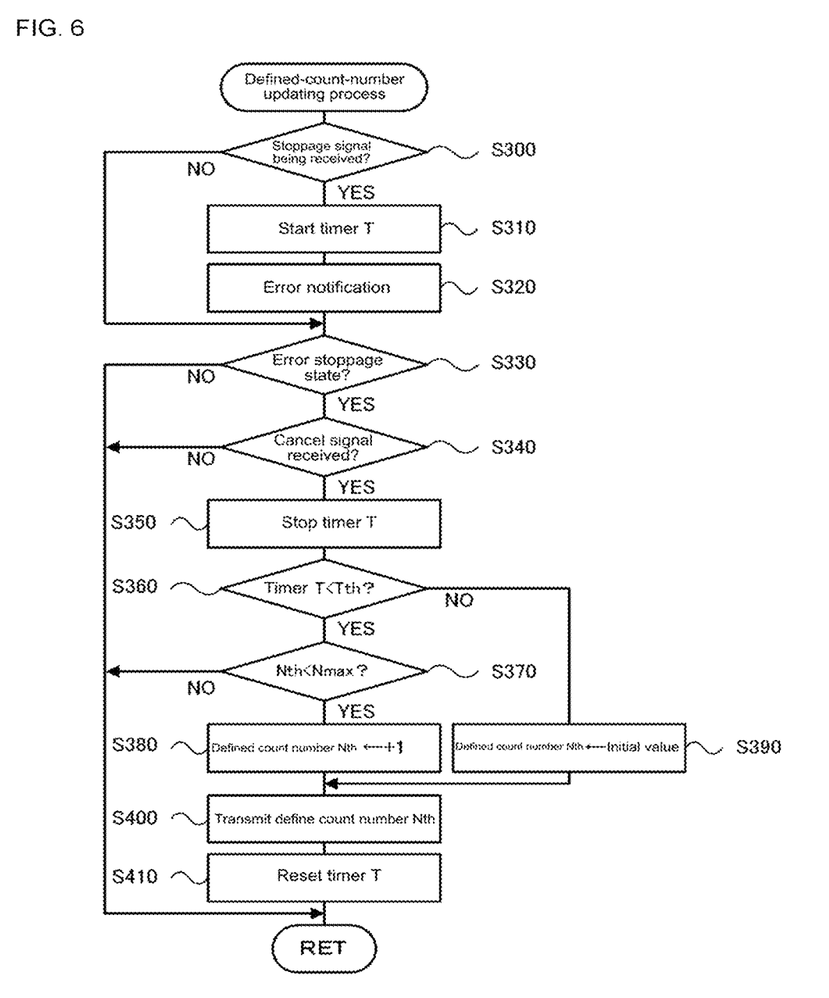
FIG. 6 is a flowchart illustrating an example of a defined-count-number updating process that is performed by management device 80.

Next, the defined-count-number updating process that is performed by management device 80 will be described. FIG. 6 is a flowchart illustrating an example of the defined-count-number updating process that is performed by CPU 81 of management device 80. This process is repeated on a predetermined time schedule.

When the defined-count-number updating process is performed, CPU 81 of management device 80 determines whether the stoppage signal that is transmitted by control device 70 in S200 of the component mounting process in FIG. 5 has been received (S300). When CPU 81 determines that the stoppage signal has not been received, the CPU proceeds to processing of S330. When the CPU determines that the stoppage signal has been received, the CPU starts timer T (S310) and performs error notification (S320). Note that, the error notification is performed by displaying a warning screen on display 88 and issuing a warning sound, thereby notifying the operator of an occurrence of an error.

Next, CPU 81 determines whether component mounting machine 10 is in the error stoppage state (S330), and when the CPU determines that the component mounting machine is in the error stoppage state, the CPU determines whether the canceling signal has been received from control device 70 of component mounting machine 10 (S340). If CPU 81 determines that the component mounting machine is not in the error stoppage state, or determines that the canceling signal has not been received, the CPU temporarily ends the defined-count-number updating process. On the other hand, if CPU 81 determines that the component mounting machine is in the error stoppage state and that the canceling signal has been received, the CPU stops timer T (S350), and the CPU determines whether a value from timer T is smaller than defined time Tth (S360). Here, timer T means the elapsed time from the error stoppage of component mounting machine 10 to the canceling of the error stoppage, and it is possible to consider the time as working time of the operator. Therefore, in a case where the value of timer T is smaller than the defined time Tth, short working time of the operator is taken, and the degree of the error of component mounting machine 10 is considered to be relatively minor. In a case where the value of timer T is larger than or equal to the defined time Tth, long working time of the operator is taken, and the degree of the error of component mounting machine 10 is considered to be relatively serious. In the present embodiment, defined time Tth is set to a time (for example, 15 seconds) which is slightly longer than the time that is normally taken for the reset operation of resetting the feeder power. In other words, the defined time Tth is set assuming a case where component mounting machine 10 does not have a prominent error and the operator performs a canceling operation quickly. When CPU 81 determines that the timer T is smaller than the defined time Tth, the CPU determines whether the defined count number Nth is smaller than the upper limit value Nmax (for example, five times) (S370) If the CPU determines that the defined count number Nth is smaller than the upper limit value Nmax, an increment in the defined count number Nth by a predetermined value (for example, a value of 1) is performed (S380). If the CPU determines that the defined count number Nth is larger than or equal to the upper limit value Nmax, the defined count number Nth is not updated. In other words, the defined count number Nth is maintained as the upper limit value Nmax. On the other hand, if CPU 81 determines that the timer T in S360 is larger than or equal to the defined time Tth, the defined count number Nth returns to an initial value Nini (S390). Here, it is possible to set the initial value Nini to zero times or once. Note that the initial value Nini is set to be changed by the operator in an initial value setting process which will be described below.

When the defined count number Nth is updated, CPU 81 transmits the updated defined count number Nth to control device 70 of component mounting machine 10 (S400), resets timer T (S410), and ends the defined-count-number updating process.

Figure 7:
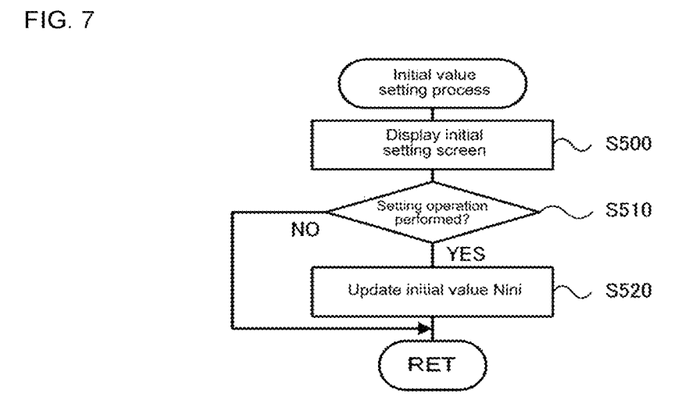
FIG. 7 is a flowchart illustrating an example of an initial value setting process that is performed by management device 80.

Next, the initial value setting process will be described. FIG. 7 is a flowchart illustrating an example of the initial value setting process that is performed by CPU 81 of management device 80. This process is performed through an instruction of the operator.

When the initial value setting process is performed, CPU 81 of management device 80 displays an initial setting screen on display 88 and receives a setting operation by the operator (S500). When CPU 81 determines that the setting operation has been performed by the operator (S510), the CPU updates the set value to the initial value (S520), and the CPU ends the initial value setting process. Here, in the present embodiment, it is possible to set the initial value within a range of the value of 0 to the upper limit value Nmax. Hence, when the upper limit value Nmax is set as the initial value, the recovery count number Nr is a constant quantity of times until the error stoppage is performed, regardless of the elapsed time from the error stoppage of component mounting machine 10 to the canceling of the error stoppage.

In component mounting system 1 of the present embodiment described above, the recovery processing is repeated until the recovery count number Nr is larger than or equal to the defined count number Nth in the case where a pickup defect has occurred, the elapsed time (timer T) is measured from the error stoppage of component mounting machine 10 to the canceling of the error stoppage in which component mounting machine 10 is subjected to the error stoppage when the recovery count number Nr is larger than or equal to the defined count number Nth, and the defined count number Nth is updated, based on the measured elapsed time. Specifically, the defined count number Nth is increased in the case where the elapsed time is shorter than the defined time Tth, and the defined count number Nth is decreased in the case where the elapsed time is longer than or equal to the defined time Tth. In this manner, it is possible to reduce the frequency of error stoppages of the device for relatively minor errors for which the operator working time is short. As a result, it is possible to improve production efficiency. Moreover, since the defined count number Nth returns to the initial value in the case where the elapsed time is longer than or equal to the defined time Tth, it is possible to perform rapid error stoppage of the device for a serious error for which the stoppage time is relatively long. In addition, since it is possible to change the initial value through an operation by the operator, it is possible to respond to diverse needs of the customers.

In component mounting system 1 of the present embodiment, the defined count number Nth is uniformly set regardless of type of pickup defect; however, the defined count number Nth may be set to be different for each type of pickup defect. In this case, in a case where CPU 71 of control device 70 determines that the pickup defect occurred in S140 or S170 to S200, the CPU identifies the type of defect, causes an increment in the recovery count number Nr corresponding to the identified type of defect to be performed, compares the recovery count number Nr to the defined count number Nth corresponding to the identified type of defect, and transmits the stoppage signal and the identified type of defect to management device 80 in a case where the recovery count number Nr is larger than or equal to the defined count number Nth. In addition, CPU 81 of management device 80 updates the defined count number Nth corresponding to the received type of defect and transmits the stoppage signal and the updated defined count number to control device 70 in the processes in S370 to S400.

In component mounting system 1 of the present embodiment, CPU 71 error-stops component mounting machine 10 in a case where pickup defects occur consecutively and the quantity of times recovery processing is performed consecutively (recovery count number Nr) reaches the defined count number Nth; however, the configuration is not limited thereto, and the error stoppage may be performed when the cumulative quantity of times recovery processing is performed reaches the defined count number Nth regardless of whether pickup defects have occurred consecutively. In this case, S150 of the component mounting process may be omitted. Note that the cumulative quantity of time recovery processing has been performed may be initialized to the value of 0 when a predetermined time elapses.

In component mounting system 1 of the present embodiment, in the case where the elapsed time (timer T) measured from the error stoppage of component mounting machine 10 to the canceling of the error stoppage is shorter than defined time Tth, the defined count number Nth is gradually increased by a predetermined value (value of 1); however, the configuration is not limited thereto, and the defined count number Nth may be updated to the upper limit value Nmax all at once, or may be changed depending on the length of the elapsed time. In the latter case, for example, the defined count number Nth may be updated such that the shorter the elapsed time, the more the defined count number.

In component mounting system 1 of the present embodiment, in a case where the elapsed time measured from the error stoppage of component mounting machine 10 to the canceling of the error stoppage is longer than or equal to the defined time Tth, the defined count number Nth returns to the initial value all at once; however, the configuration is not limited thereto, and the defined count number may gradually return to the initial value by a predetermined value (for example, by the value of 1).

In component mounting system 1 of the present embodiment, the measuring of the elapsed time (timer T) measured from the error stoppage of component mounting machine 10 to the canceling of the error stoppage, the updating of the defined count number Nth, and the setting of the initial value are performed in management device 80; however, the configuration is not limited thereto, and the operations described above may be performed in component mounting machine 10.

In component mounting system 1 of the present embodiment, it is possible to change the initial value of the defined count number Nth through an operation by the operator; however, the initial value may be unchangeable.

Here, a corresponding relationship between principal elements of the disclosure is described. In other words, suction nozzle 51 corresponds to "holding device", CPU 71 of control device 70 that performs processes (image processing) in S130 and S140 of the component mounting process in FIG. 5 corresponds to "determination device", CPU 71 that performs the process (mounting operation) in S160 of the component mounting process corresponds to "mounting device", CPU 71 of control device 70 that performs the processes (recovery processing) in S100 and S180 of the component mounting process corresponds to "recovery device", CPU 71 of control device 70 that performs the process (increment of the recovery count number Nr) in S170 of the component mounting process corresponds to "counting device", CPU 71 of the control device 70 that performs the process (error stoppage) in S190 of the component mounting process corresponds to "error stoppage device", CPU 71 of control device 70 that performs the processes in S210 and S220 of the component mounting process corresponds to "canceling device", CPU 81 of management device 80 that performs the processes (start and stop of the timer T) in S300 to S350 of the defined-count-number updating process in FIG. 6 corresponds to "timekeeping device", CPU 81 of management device 80 that performs the processes (process of the increment in the defined count number Nth or returning of the defined count number Nth to the initial value) in S360 to S400 of the defined-count-number updating process corresponds to "defined-count-number updating device". In addition, CPU 81 of management device 80 that performs the initial value setting process in FIG. 7 corresponds to "initial value setting device".

Note that the present disclosure is not limited to the embodiments described above, and it is needless to say that the present disclosure may be embodied as various aspects within the technical scope of the present disclosure.

INDUSTRIAL APPLICABILITY

The present disclosure may be used in industrial manufacturing equipment such as a component mounting system.

REFERENCE SIGNS LIST

1: component mounting system, 10: component mounting machine, 11: base, 12: main body frame, 14: support table, 20: component supply device, 21: case, 22: reel, 24: tape feeding mechanism, 26: driving motor, 28: control board, 29: connector, 30: board conveyance device, 32: belt conveyor device, 34: backup plate, 40: XY robot, 41: X-axis guide rail, 42: X-axis slider, 43: Y-axis guide rail, 44: Y-axis slider, 46: X-axis actuator, 47: X-axis position sensor, 48: Y-axis actuator, 49: Y-axis position sensor, 50: head, 51: suction nozzle, 52: Z-axis actuator, 54: θ-axis actuator, 56: mark camera, 57: electromagnetic valve, 58: vacuum pump, 59: air pipe, 60: parts camera, 70: control device, 71: CPU, 72: ROM, 73: HDD, 74: RAM, 75: input and output interface, 76: bus, 80: management device, 81: CPU, 82: ROM, 83: HDD, 84: RAM, 85: input and output interface, 86: bus, 87: input device, 88: display, S: board, P: component

The invention claimed is:

1. A component mounting system comprising:
a nozzle configured to hold a component, and
a controller configured to
    determine whether holding of the component is correctly performed by the nozzle,
    control the nozzle to mount the held component on a target object in a case where the controller determines that the holding of the component is correctly performed, and
    perform recovery processing of re-performing the holding of the component by the nozzle in a case where the controller determines that the holding of the component is not correctly performed;
    count the quantity of times the recovery processing is performed;
    error-stop the component mounting system in a case where the quantity of times the recovery processing is performed reaches a defined count number;
    cancel the error stoppage of the component mounting device, based on an operation of an operator;
    measure an elapsed time from the error stoppage of the component mounting system to the canceling of the error stoppage; and
    update the defined count number, based on the measured elapsed time.

2. The component mounting system according to claim 1, wherein the controller increases the defined count number in a case where the error stoppage is canceled before the elapsed time has reached a predetermined time, and the controller decreases the defined count number in a case where the error stoppage is canceled when the elapsed time has reached the predetermined time or later.

3. The component mounting system according to claim 2, wherein the controller increases the defined count number by a predetermined count number whenever the error stoppage is canceled before the elapsed time has reached the predetermined time.

4. The component mounting system according to claim 2, wherein the controller causes the defined count number to return to an initial value in the case where the error stoppage is canceled when the elapsed time has reached the predetermined time or later.

5. The component mounting system according to claim 1, wherein the controller is configured to set an initial value of the defined count number, based on the operation of the operator.

6. The component mounting system according to claim 1, wherein the controller determines a type of a holding defect, in which the holding of the component is not correctly performed,
the controller counts the quantity of times the recovery processing is performed for each of the types of holding defect,
multiple defined count numbers associated with each of the types of holding defect are set as the defined count number by the controller,
the controller error-stops the component mounting system in a case where the quantity of times the recovery processing is performed reaches a defined count number corresponding to the determined type of holding defect, and the controller updates the defined count number corresponding to the determined type of holding defect, based on the elapsed time measured by the controller in a case where the component mounting system was error-stopped due to the determined holding defect and then the error stoppage canceled.

\* \* \* \* \*

UNITED STATES PATENT AND TRADEMARK OFFICE
CERTIFICATE OF CORRECTION

PATENT NO. : 10,477,751 B2
APPLICATION NO. : 15/513206
DATED : November 12, 2019
INVENTOR(S) : Shigeki Hayashi Page 1 of 1

It is certified that error appears in the above-identified patent and that said Letters Patent is hereby corrected as shown below:

On the Title Page

Item (71), the Applicant's name is incorrect. Item (71) should read:
--(71) Applicant: FUJI CORPORATION, Chiryu-shi (JP)--

Signed and Sealed this
Twenty-first Day of January, 2020

Andrei Iancu
*Director of the United States Patent and Trademark Office*